United States Patent [19]

Takahashi

[11] Patent Number: 5,108,949

[45] Date of Patent: Apr. 28, 1992

[54] SEMICONDUCTOR LASER AND LASER FABRICATION METHOD

[75] Inventor: Shogo Takahashi, Itami, Japan

[73] Assignee: Mitsubishi Denki Kabushiki Kaisha, Japan

[21] Appl. No.: 695,219

[22] Filed: May 3, 1991

Related U.S. Application Data

[62] Division of Ser. No. 446,931, Dec. 6, 1989, Pat. No. 5,027,363.

[30] Foreign Application Priority Data

Dec. 9, 1988 [JP] Japan .................. 63-312504

[51] Int. Cl.$^5$ .................. H01L 21/20; H01L 21/205; H01L 21/208
[52] U.S. Cl. .................. 437/129; 437/133; 437/167
[58] Field of Search .................. 437/129, 133, 167; 372/44, 45, 46

[56] References Cited

U.S. PATENT DOCUMENTS

| 4,511,408 | 4/1985 | Holonyak, Jr. | 437/129 |
| 4,716,125 | 12/1987 | Makiuchi | 437/129 |
| 4,873,696 | 10/1989 | Coldren et al. | 372/96 |
| 4,888,781 | 12/1989 | Omura et al. | 372/46 |
| 4,937,835 | 6/1990 | Omura | 372/48 |

FOREIGN PATENT DOCUMENTS

| 62-67890 | 3/1987 | Japan . |
| 62-130581 | 6/1987 | Japan . |
| 62-244167 | 10/1987 | Japan . |
| 62-282482 | 12/1987 | Japan . |
| 63-56955 | 3/1988 | Japan . |
| 63-56977 | 3/1988 | Japan . |

OTHER PUBLICATIONS

"AlGaAs MQW Laser With Electrodes on Epi-Layer", by Hirose et al., 18a-ZR-9, Prescripts of Autumn Meeting, 1987, Japanese Association of Applied Physics.

"AlGaAs/GaAs Lateral Current Injection MQW Laser", by Makiuchi et al., Conference on Lasers and Electro-Optics, 1987.

Primary Examiner—Olik Chaudhuri
Assistant Examiner—Ourmazd S. Ojan
Attorney, Agent, or Firm—Leydig, Voit & Mayer

[57] ABSTRACT

A planar type semiconductor laser having p-side and n-side electrodes on the same side of the substrate. The substrate carries a number of layers including lower and upper cladding layers sandwiching an active layer. Both of the cladding layers are of n-type material. A pair of p-type diffusion regions serve to define the width of an undisordered active stripe in the active layer. A first relatively deep diffusion region penetrates both cladding layers and extends into the substrate. A second shallower diffusion region spaced, from the first, penetrates only to the lower cladding layer and leaves a channel below the diffusion front in the lower cladding layer for conduction of carriers. The distance between the p-type diffusion regions defines the width of the active layer. An n-side electrode is formed on the upper surface of the semiconductor device and in electrical contact with the n-type cladding layers. A p-side electrode is formed on the upper surface of the semiconductor layer in electrical contact with the first p-type diffusion region.

9 Claims, 4 Drawing Sheets

SEMICONDUCTOR LASER AND LASER FABRICATION METHOD

This is a continuation of copending application(s) Ser. No. 446,931, filed on Dec. 6, 1989, now U.S. Pat. No. 5,027,363.

FIELD OF THE INVENTION

This invention relates to semiconductor lasers, and more particularly to planar type semiconductor lasers in which both p-side and n-side electrodes are formed on the same surface of the semiconductor laser device.

BACKGROUND OF THE INVENTION

Semiconductor lasers as discrete devices often enjoy the luxury of having p-side and n-side electrodes on opposite sides of the semiconductor device. One electrode can be formed on a doped substrate and the other on the opposite surface of the semiconductor device on which the epitaxially grown and treated layers are formed.

It is often useful to produce laser devices in which both the p-side and n-side electrodes are on the same surface of the semiconductor device, usually the surface opposite the substrate which carries the epitaxially grown and otherwise treated semiconductor layers. Lasers with both electrodes on a single surface are often called "planar type" lasers. That term is typically taken to mean that the electrodes are formed on the same surface of the laser, and also at about the same "level" with respect to the substrate. Among the reasons for forming devices of this type is the possibility of integrating the laser with other electronic circuitry.

FIG. 4 shows in cross section the structure of a multi-quantum well laser of the planar type as an example of a prior art structure. The FIG. 4 laser device is based on a semi-insulative GaAs substrate 1. Formed on the GaAs substrate in sequence are a p-type AlGaAs lower cladding layer 21, a multi-quantum well active layer 3, an n-type AlGaAs upper cladding layer 4, and an n-type GaAs contact layer 5. P-type diffusion regions 9, typically Zn diffusion regions, are formed to disorder the portions of the multi-quantum well active layer 3 which they invade, and to leave a non-disordered central stripe portion 30 of the active layer to serve as a light-emitting region. The p-type diffusion regions 9 invert the conductivity of the invaded portions of the n-type AlGaAs upper cladding layer 4 and n-type GaAs contact layer 5. Thus, p-side electrodes 12 formed over the p-type diffusion regions 9 serve as the positive electrode for the device, whereas an n-side electrode 11 formed over the active stripe region 30 forms a connection for the n electrode. The contact region 5 is divided in about the area of the active region 30 to electrically disconnect the material underlying the p-side and n-side electrodes.

In production, there are successively grown on a semi-insulative GaAs substrate, by conventional epitaxial growth processes, the p-type AlGaAs lower cladding layer 21, multi-quantum well active layer 3, n-type AlGaAs upper cladding layer 4, and n-type GaAs contact layer 5. Following the epitaxial growth process, the upper surface of the device is masked, a source of Zn impurities is formed on the upper surface of the device, and the device is annealed to form p-type diffusion regions 9. Diffusion is conducted until the diffusion front reaches the substrate and defines a narrow non-disordered active stripe 30 in the active layer, bounded by diffusion-induced disordered regions. As suggested in the drawings, diffusion proceeds both downwardly and laterally, and the diffusion conditions are controlled to define a very narrow stripe 30 necessary to assure single transverse mode oscillation. The stripe width 30 is typically on the order of 2 microns or less, suggesting the precision required of the diffusion operation.

Following the formation of the p-type diffusion regions 9, the diffusion source and mask are removed, the n-type GaAs contact layer 5 is etched to separate the central portion from the end portions of that layer, and n-side and p-side electrodes 11, 12, respectively, are produced by conventional plating and lift-off techniques. It will be appreciated that the size and positioning of the n-side electrode 11 must be controlled very accurately since it cannot extend beyond the relatively narrow central stripe 30 without producing defective devices.

In operation, when a bias source is connected, positive terminal to p-side electrodes 12 and the negative terminal to n-side electrode 11, a p-n junction across the non-disordered central stripe 30 will be forward biased to cause current flow. Holes will flow from the positive terminal of the bias source through the p-side electrode 12 and the disordered region 9. Electrons will flow through the n-type electrode 11, the n-type contact layer 5 and the n-type upper cladding layer 4. The diffusion voltage of the multi-quantum well layer 3 is lower than the diffusion voltage of the p-n junctions formed in the upper and lower cladding layers 4, 2, respectively, and therefore carriers will be injected into the non-disordered central stripe 30 of the multi-quantum well active layer 3. As a result of carrier injection into the non-disordered stripe 30, light emission occurs. Since the refractive index of the stripe 30 is higher than that of the disordered regions of the active layer 3 and higher than that of the upper and lower cladding layers 2, 4, light is substantially confined to the narrow stripe 30. Since the width of that stripe is made relatively small, such as on the order of 2 microns, oscillation occurs in a stable single transverse mode, and the laser device itself exhibits a relatively low threshold current. It is a feature of the FIG. 4 embodiment that both p- and n-side electrodes 12, 11 are produced on the same side of the device and with a small or insubstantial step difference, thereby making the device suitable for integration.

The device of FIG. 4, however, suffers from a substantial drawback in balancing the need for a very small stripe width against processability of the device. Whereas single transverse mode operation demands a relatively narrow stripe width, the structure of the device demands an electrode which is no wider than the stripe width, requiring significant precision in forming the n-side electrode 11 over the central stripe 30 in order to prevent the n-side electrode from overlying or contacting the relatively larger p-side electrode areas. Since the structure of the laser limits the width of the electrode 11, the resistance of the n-side electrode can become quite high, thereby resulting in a significant limitation in use of such a diode in a continuous oscillation mode. Thus, the prior art device of FIG. 4 possesses not only processing difficulties which can tend to limit yield, but also operational difficulties in that the operating mode must take into account the relatively higher contact resistance which goes hand-in-hand with the narrow electrode width.

SUMMARY OF THE INVENTION

In view of the foregoing, it is a general aim of the present invention to provide a semiconductor laser and fabrication method which provides substantial control over the width of the active stripe without unduly limiting the size, shape or placement of the p- and n-side electrodes which are formed on the same surface of the device.

In that regard, it is an object of the present invention to provide a semiconductor laser in which the definition of the active stripe width in a quantum well laser is made substantially independent of the size, shape and placement of the electrodes which connect to the p-n junction formed at the active stripe.

Thus, an objective of the present invention is to provide a planar type semiconductor laser and fabrication technique in which the stripe width can be adequately, easily and reliably controlled but without unduly limiting the width or placement of the electrodes which are electrically connected to the layers bounding the stripe.

It is a feature of the present invention that the p-side and n-side electrodes are formed on the same surface of the semiconductor laser, a pair of diffusion regions define the width of the active stripe, but one of the diffusion regions has a diffusion front which terminates in the lower cladding layer, providing a channel-like region of the lower cladding layer for conduction of carriers from the stripe to an associated electrode displaced outwardly of the stripe.

In accordance with the invention, there is provided a planar type semiconductor laser in which a substrate carries a plurality of semiconductor layers which include at least a lower cladding layer, a quantum well active layer, and an upper cladding layer, both of the cladding layers being of n-type conductivity. A pair of p-type impurity diffusion regions are provided. A first p-type diffusion region penetrates both cladding layers and the active layer and terminates in the substrate. A second shallower p-type diffusion region has a front which terminates in the lower cladding layer, leaving a portion of the lower cladding layer of n-type conductivity. The distance between the two p-type diffusion regions defines the narrow stripe of the active region. An n-side electrode is formed in electrical contact with the n-type cladding layers (and thereby in electrical contact with the channel underlying the second p-type diffusion region). A p-side electrode is formed in contact with the first p-type diffusion region. Thus, the p-n junction which is formed across the narrow stripe of the active region is connected to the electrodes, and forward bias applied to the electrodes creates laser oscillation by carrier injection. The size of the electrodes, and particularly the n-side electrode, is substantially independent of the width of the active region stripe. Thus, the n-side electrode can be made much wider than in the FIG. 4 device, and contact resistance can be substantially reduced.

In accordance with a method of fabricating the laser device, in one embodiment, both p-type diffusion regions can be formed in the same diffusion operation, and different widths for the diffusion masks for the two stripes are utilized to achieve the differential depth necessary to the practice of the invention. In a second embodiment, the first and second p-type diffusion regions are formed independently of each other, allowing substantial and independent control over the diffusion depth and width of the respective p-type diffusion regions.

Other objects and advantages will become apparent from the following detailed description when taken in conjunction with the drawings, in which:

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
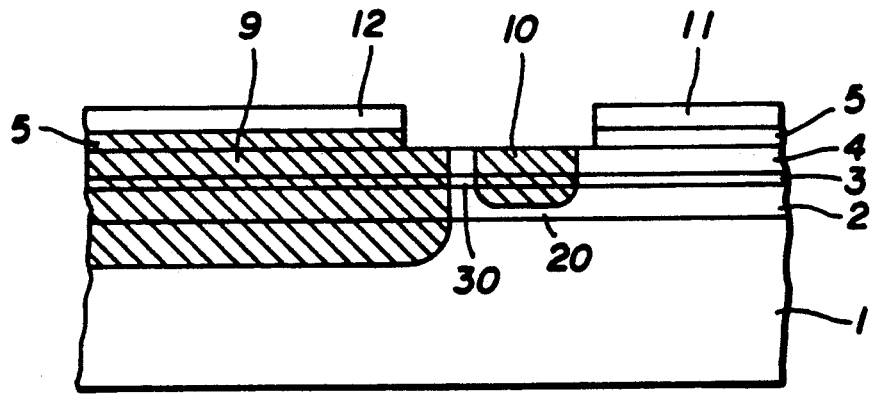
FIG. 1 is a cross-sectional view illustrating the structure of a planar type semiconductor laser device exemplifying the present invention.

Turning now to the drawings, FIG. 1 shows, in cross-section, a planar type semiconductor laser exemplifying the present invention. The laser is formed on a semi-insulative substrate 1 such as GaAs having first surface on which a number of semiconductor layers are formed. The semiconductor layers include epitaxially grown lower cladding layer 2, active layer 3, upper cladding layer 4, and contact layer 5. The cladding layers 2, 4 are both of the same conductivity type, in the present example n-type. Both cladding layers are of AlGaAs. The contact layer 5 is n-type GaAs. The active layer 3 is a quantum well structure and can be a single quantum well structure but is preferably a multi-quantum well structure. A single quantum well, as is well known, includes a single well layer, typically GaAs, sandwiched between a pair of quantum barrier layers, typically AlGaAs. A multi-quantum well structure has alternating quantum barrier and quantum well layers formed one on the other. The cladding layers 2, 4 are defined above as upper and lower cladding layers, simply to distinguish one from the other. The lower cladding layer is conventionally defined as that nearest the substrate, and the terms lower and upper are intended only to distinguish the two layers when necessary rather than to provide a definition of any spatial orientation of the laser.

In practicing the invention, the planar laser device of FIG. 1 includes a pair of diffusion regions, a first p-type diffusion region 9 penetrating all of the aforementioned epitaxially grown layers and extending into the substrate 1. As such, the first diffusion region 9 appears superficially similar to the diffusion regions of the prior art. However, the device of FIG. 1 also includes a second p-type diffusion region 10 which is much shallower than the region 9, and is also much smaller in cross-sectional area. It is seen that the second shallower p-type diffusion region 10 is displaced from the first diffusion region 9 and forms a narrow stripe 30 in the active layer 3 between the two diffusion regions. The control of the width of stripe 30, as will become more apparent, is much more precise since it is formed in large measure by control of the lateral diffusion front of the region 10, and the relatively smaller diffusion distance which must be traversed by the impurities in the region 10 helps to more accurately control the width of the stripe 30.

In accordance with an important feature of the invention, the shallower diffusion region 10 has a diffusion front which terminates in the lower cladding layer 2, leaving a small channel 20 in the n-type diffusion layer 2 which remains of n-type conductivity and thus provides a path for carrier flow to the central stripe region 30. Thus, while the diffusion region 9 and shallower diffusion region 10 disorder the active layer to define the non-disordered central stripe 30, termination of the diffusion front of the shallower region 10 in the n-type cladding layer to produce an n-type channel 20 provides a path for carrier flow to the thus confined central stripe, such path extending beyond the relatively small width of the diffusion region 10.

After the diffusion regions 9, 10 are formed, the n-type cladding layer 5 is etched to form an aperture over both the central stripe 30 and the shallower p-type diffusion region 10. A p-side electrode 12 is formed over the left-hand portion of the contact layer 5. It will be appreciated that the left portion of the contact layer 5 had been inverted in conductivity by virtue of the p-type diffusion region 9, and thus the p-side electrode 12 is in electrical contact by means of the p-type conductivity material to the central stripe 30 of the active layer 3.

In accordance with the invention, an n-side electrode 11 is formed on the remainder of the n-type contact layer 5 and is in electrical contact with both the channel region 20 and by way of that channel region to the n-type material which bounds the central stripe 30. Recalling that the right-hand portion of n-type contact layer 5 has not been inverted in conductivity, it will be seen that the n-type electrode 11 is in electrical contact through n-type material including the channel 20 to the portion of the n-type lower cladding layer which underlies the central stripe 30.

Figure 2A:
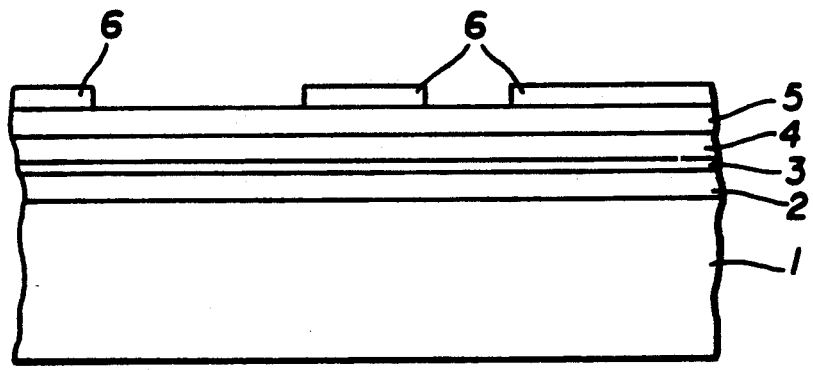
FIGS. 2a-2c illustrate the steps of a production process for fabricating a laser of the type illustrated in FIG. 1.
Figure 2B:
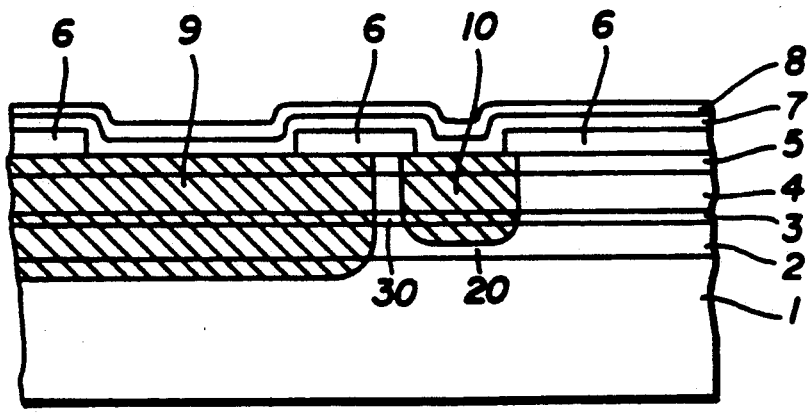
Figure 2C:
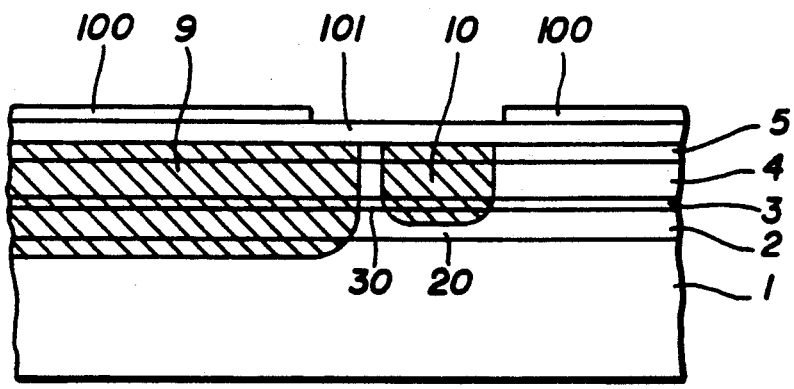

FIGS. 2a-2c illustrate a first method for producing a laser device as illustrated in FIG. 1. A conventional epitaxial growth process, such as MOCVD, is used to form successive layers on a semiinsulative GaAs substrate, the successive layers comprising an n-type AlGaAs lower cladding layer 2, a multi-quantum well active layer 3 comprising alternate AlGaAs barrier layers and GaAs well layers, an n-type AlGaAs upper cladding layer 4, and an n-type GaAs contact layer 5. Following the epitaxial growth process, a masking film 6 such as silicon nitride is produced and patterned as illustrated in FIG. 2a. A pair of apertures for defining the diffusion regions are formed in the silicon nitride film 6 by photolithography and etching. It is seen that the right-hand aperture is substantially narrower than the left-hand aperture and, as will be described below, the respective widths of the apertures in the FIG. 2 process is a measure of control of the depth of the diffusion front for the respective diffusion zones.

Following the patterning of the diffusion regions as illustrated in FIG. 2a, a diffusion source in the form of a ZnO film 7 is formed over the entire surface of the partly completed semiconductor device. A cap layer, such as an $SiO_2$ film 8 is deposited over the ZnO. The device is then annealed to diffuse the Zn impurities through the epitaxially grown layers and in part into the semiconductor substrate as illustrated in FIG. 2b. It is seen that the wider diffusion zone at the left of the semiconductor causes a deeper diffusion which penetrates not only the active layer, cladding layers and contact layer, but also penetrates directly into the substrate 1. The much narrower stripe at the right side of the semiconductor produces a much shallower diffusion region 10, penetrates the contact, upper cladding and active layers, but has a diffusion front which terminates in the lower cladding layer 2, leaving the aforementioned channel 20 of n-type conductivity. By differentiating the areas of the apertures in the silicon nitride mask as shown in FIG. 2a, the diffusion speed and depth can be differentiated to cause a deep penetration of the larger diffusion region 9 while terminating the shallower diffusion region 10 with a front in the lower cladding layer 2. It is also known that in addition to diffusing impurities depth-wise through the respective layers, diffusion also occurs in the lateral direction, and FIG. 2b illustrates such lateral diffusion by showing the diffusion regions 9, 10 as being wider than the stripes which gave rise to those diffusion regions. Thus, the stripe widths and positions are controlled such that the lateral extent of the diffusion produces a narrow (on the order of 1 or 2 microns) central stripe 30 in the active region of non-disordered material bounded by diffusion-induced disordered regions of the active layer.

A typical diffusion speed for Zn impurities from ZnO through materials such as that discussed here is about 2 microns per hour at a temperature of about 660° C. Furthermore, a relationship exists between the stripe aperture widths and the diffusion speed such that a diffusion speed ratio of about 2:1 can be obtained when there is an aperture width ratio of about 10:1.

In a typical embodiment of the device shown in FIG. 2, the thicknesses of the upper and lower cladding layers are about 2 microns, that of the contact layer 5 is about 1 micron. Stripe widths can be used such that the width for the broader diffusion region 9 is in the range between about 50 to 100 microns, and the stripe for producing the narrower diffusion region 10 is in the range between about 4 to 5 microns, producing a width ratio of about 10:1. When the interval between the two apertures in the mask 6 is about 10 microns, the width of the light-emitting region 30 in the active layer 3 can be easily controlled to 2 microns or less, a dimension which is useful to assure fundamental mode oscillation of the laser. This is as a result of the known ratio of diffusion speed based on the width ratio of the mask apertures as well as the known speed of lateral diffusion of impurities through those materials.

After the diffusion regions 9, 10 are produced as shown in FIG. 2b, the ZnO impurity source layer 7 and silicon dioxide cap layer 8 are removed by conventional processes. A photoresist mask 100 is then formed and patterned as shown in FIG. 9c exposing the central portion of the contact layer 5 which overlies both the central stripe 30 and the shallower diffusion region 10. Conventional etching techniques are then used to remove the central portion of the GaAs contact layer 5 producing an electrical discontinuity in the contact layer. It is recalled that the p-type diffusion region 9 has inverted the conductivity of the left-hand portion of the contact layer 5.

Thus, the formation of p-side and n-side electrodes as shown in FIG. 1 will allow contact through the device as in a conventional diode, but with electrodes which are much larger than has heretofore been possible on a planar semiconductor laser. Conventional plating and liftoff techniques are used to form the electrodes 11, 12.

The n-side electrode 11 is in electrical contact with the n-type cladding layers 2, 4, and thereby through the channel portion 20 which underlies the shallow diffusion region 10, to provide an n-side source of electrons below the central stripe 30 of the active layer 3. Similarly, the p-side electrode 12 is in electrical contact with the inverted portions of the contact layer 5 and upper cladding layer 9 such that a forward biased p-n junction is formed across the central stripe 30 allowing injection of carriers into that stripe and the resulting laser oscillation.

Figure 4:
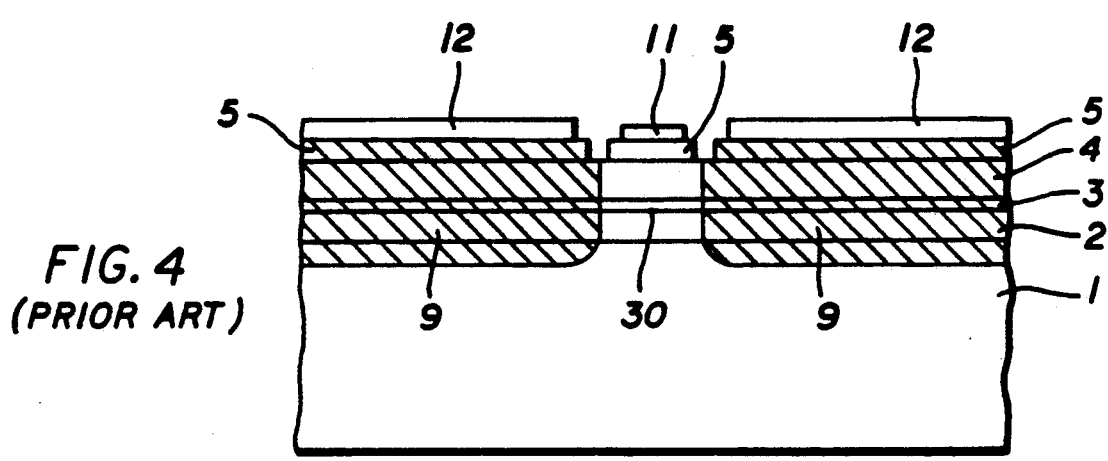
FIG. 4 is a cross-sectional view showing a planar-type semiconductor laser device according to the prior art.

The freedom in formation of the n-side electrode 11 as compared with the restrictions necessary for forming the n-side electrode in the FIG. 4 prior art embodiment will now be apparent. Furthermore, the control of the width of the central stripe region 30 by means of the paired p-type diffusion regions, one of which has only a very small depth of penetration, will also be apparent.

Figure 3A:
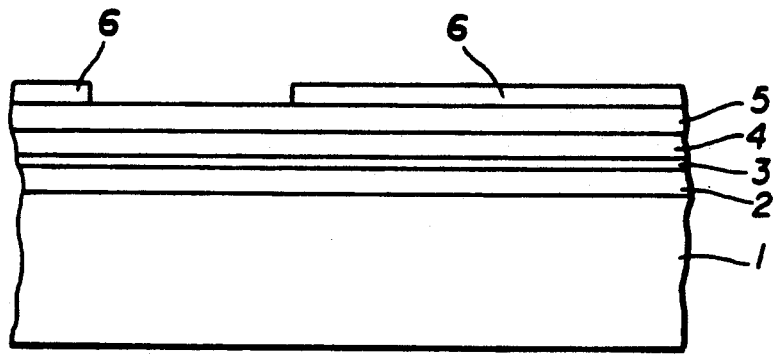
FIGS. 3a-3e illustrate the steps of an alternative production process for fabricating a laser of the type illustrated in FIG. 1.
Figure 3B:
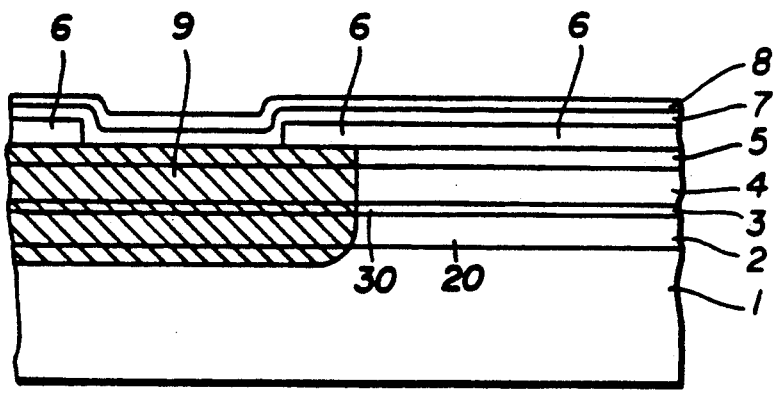

Turning now to FIGS. 3a-3e, there is shown an alternative fabrication technique for forming a semiconductor laser diode of the type illustrated in FIG. 1. In contrast to the FIG. 2 embodiment, the embodiment of FIG. 3 forms the two diffusion regions 9, 10 in separate diffusion steps, and thus is better able to alter the diffusion parameters during that operation in order to better control the depth and extent of the respective diffusion regions. Thus, in FIG. 3a, the epitaxially grown lower and upper cladding layers, active layer, and contact layer are formed as in FIG. 2a. A silicon nitride mask 6 is formed over the cladding layer 5, but is patterned to have only a single aperture, in the preferred form, the larger of the two apertures. As shown in FIG. 3b, a source of impurities in the form of a ZnO film 7 covered by a cap film 8 is then formed such that impurities are available for forming the first diffusion zone 9. The partly completed device is then annealed to produce the deeper of the two diffusion zones 9, following which the ZnO film 7 and cap layer 8 are removed.

Figure 3C:
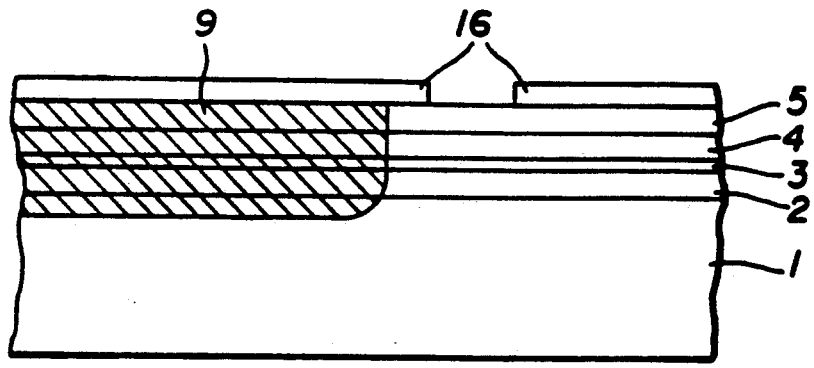
Figure 3D:
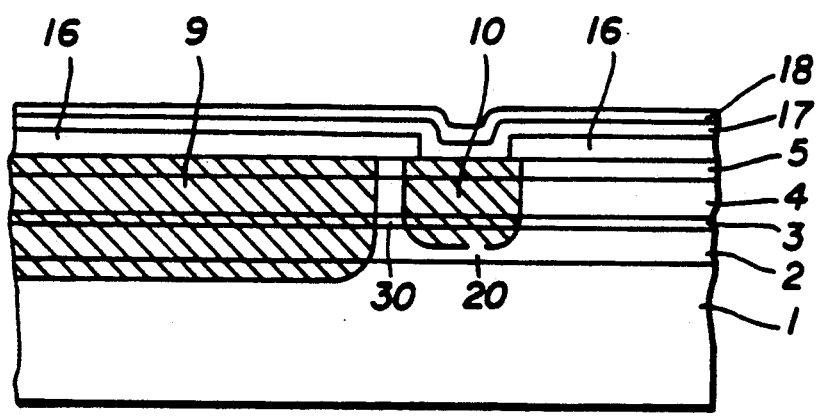
Figure 3E:
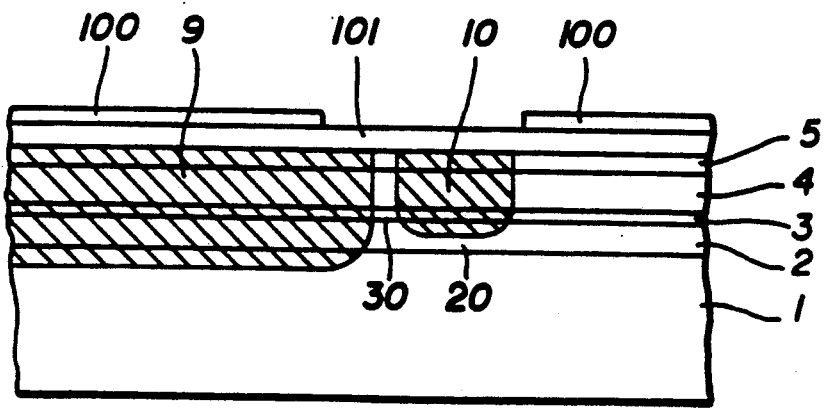

After formation of the first diffusion region 9, a new masking film 16 of silicon nitride is formed over the surface of the partly completed device and a second aperture is formed in that film as illustrated in FIG. 3c. The second aperture is that which will be used to form the second diffusion region 10. Following formation of the mask 16, a further impurity carrying film such as ZnO film 17 and cap layer 18 of silicon dioxide are formed, similar to the operation which produced the partly completed device of FIG. 3b. As shown in FIG. 3d, the ZnO film 17 then is available as a diffusion source to form the second or shallower diffusion region 10, independently of the first diffusion region 9. The time and temperature of diffusion are thus controlled to cause the diffusion region 10 to form to define the central stripe 30 of the desired width and to terminate the diffusion front in the lower cladding layer 2, leaving a channel 20 for conduction of carriers to the section of the lower cladding layer underlying the non-disordered central stripe 30.

Following the formation of the second diffusion region 10, the ZnO film 17 and SiO₂ film 18 are removed. As in the prior embodiment, a photoresist mask 100 is formed and patterned to reveal the central portion of the contact layer 5, and the device is etched to remove that central portion, thus leaving separate portions of the contact layer 5 for connection to the p-side and n-side electrodes, respectively. Following etching of the contact layer, p-side and n-side electrodes 12, 11 as shown in FIG. 1 are formed over the respective sections of the contact layer, to complete a laser device in accordance with the invention.

The fabrication processes are similar to each other in that they both form a device substantially as illustrated in FIG. 1. The process of FIG. 2 is somewhat simpler in that only a single diffusion operation need be performed, but the diffusion conditions, including concentration of impurity source, relative width and placement of the apertures, and diffusion time and temperature must be accurately controlled so that both diffusion regions 9, 10 can be formed with their respective characteristics, but at the same time. The FIG. 3 process introduces an additional complication by requiring a completely separate masking and diffusion step for each of the diffusion regions 9, 10 but allows independent control of the diffusion conditions for forming those independent zones, and thus may, in some cases, produce a higher yield. In both cases, solid phase diffusion is preferably utilized for forming the diffusion regions 9, 10, which enables use of low temperature annealing, which in turn is not harmful to the characteristics of the quantum well. It is known that diffusion operations which require substantially higher temperatures can tend to disorder the quantum wells, producing laser devices of inferior characteristics.

Turning again to FIG. 1, the operation of the device will be reviewed in greater detail. When a source of d-c potential is connected to the laser device, with the positive terminal of the source connected to p-side electrode 12 and the negative terminal to n-side electrode 11, the p-n junction formed across the non-disordered central stripe region 30 of the active layer 3 is forward biased. It is seen that the n-side electrode 11 provides a path for electron flow through the right-hand portion of contact layer 5, the n-type upper and lower cladding layers 2, 4 and the undoped but relatively thin multi-quantum well structure 3. In accordance with the invention, the channel 20 below the shallower diffusion region 10 provides a path for electron flow to the region below the non-disordered stripe 30.

Similarly, the p-side electrode 12 provides a path for conduction of carriers through the p-type diffusion region 9 which includes the portions bounded by region 9 of the contact layer 5 and upper cladding layer 4 and, to the extent necessary, the active layer 3. Thus, a p-n junction is formed across the non-disordered central stripe 30, allowing the injection of carriers into the central stripe and the resulting laser operation. It will be appreciated that the width of the central stripe 30 can easily be controlled in accordance with the invention, particularly considering the relatively insubstantial length of impurity travel in the shallow diffusion region 10, to a width of about 1 or 2 microns, to assure operation of the laser in the single transverse mode. Since both sides of the active layer 3 adjacent the non-disordered region 30 are disordered by diffusion, the refractive indices of the disordered regions are lower than that of the central region 30, and light is confined in the light emission region 30 as in a light guide, producing a high efficiency laser.

While in the above-illustrated embodiment, a GaAs type multi-quantum well laser is described, a single quantum well laser, which can comprise other materials as InP, or a laser of different structure can be used in practicing the invention.

Furthermore, in the above-described embodiments, while a ZnO film is used as a source of p-type impurities, it will be appreciated that other diffusion sources or diffusion techniques can also be utilized with substantially the same effects as described above. It will be appreciated, however, that the solid phase diffusion from a ZnO film is among the preferred embodiments because of the low temperature diffusion which it allows and the relatively precise control of the diffusion front.

It will now be appreciated that there has been provided an improved method of fabricating a planar-type laser device having both p-side and n-side electrodes on the same surface of the semiconductor. The laser device is formed with cladding layers sandwiching the active layer, both cladding layers being of the same conductivity type, preferably n-type. A pair of p-type diffusion regions are used to define the width of the central stripe, but the p-type diffusion regions are of substantially different depth. A first of the diffusion regions is allowed to penetrate into the substrate as is conventional. A second of the diffusion regions is shallow, which allows control of the width of the non-disordered central stripe 30 and allows termination of the diffusion operation with the diffusion front of the shallower region in the lower cladding layer. Terminating the second diffusion region in the lower cladding layer produces an n-type conductivity channel in the lower cladding layer which underlies the p-type diffusion region. Thus, the second p-type diffusion region blocks the upper cladding layer, disorders the active layer, and allows carrier flow through a portion of the lower cladding layer, enabling the formation of an accessible p-n junction across the non-disordered central stripe as is desired. The provision of a channel underlying the shallower diffusion region allows formation of an n-side electrode in electrical contact with that channel through the n-type cladding layers, such that the size and position of the n-type electrode need not be tightly controlled as in the past, but can be as freely placed as the p-side electrode.

In practicing alternative forms of the invention, the two unequal depth p-type diffusion regions can be formed in the same operation by controlling the relative width and placement of the two stripes, providing a very narrow width mask for diffusion of the shallower channel. Alternatively, the two diffusion regions can be formed separately, allowing independent control of the depth of penetration of the two diffusion regions.

The resulting laser is easily integratable since it has both p- and n-side electrodes on the same surface of the device, has good yield and reproducibility because of the control over the width of the central stripe 30, and is not limited in power dissipation by the size of either the p-side or n-side electrodes, since the size and placement are relatively unencumbered by the narrowness or location of the central stripe 30.

What is claimed is:

1. A method of fabricating a planar type semiconductor laser having p-side and n-side electrodes on a planar surface of the laser device, the method comprising the steps of:
   successively growing on a semiconductor substrate at least an n-type lower cladding layer, a quantum well active layer, and an n-type upper cladding layer,
   selectively producing a first p-type diffusion region extending through said layers and reaching said substrate,
   selectively producing a second p-type diffusion region shallower than the first p-type diffusion region, the second p-type diffusion region extending through said upper cladding layer and said active layer and terminating in said lower cladding layer leaving an n-type channel in said lower cladding layer below the diffusion front of the second p-type diffusion region,
   spacing the p-type diffusion regions from each other by an extent sufficient to define a narrow non-disordered active region in the active layer,
   forming an n-side electrode over the upper cladding layer in electrical contact with the n-type cladding layers but out of electrical contact with either of said p-type diffusion regions, and
   forming a p-side electrode over the upper cladding layer in electrical contact with the first p-type diffusion region.

2. The method as set forth in claim 1 wherein the steps of selectively producing a first p-type diffusion region and a second p-type diffusion region are accomplished simultaneously by diffusing separate regions having different widths and different depths of diffusion front.

3. The method as set forth in claim 1 wherein the step of selectively producing a first p-type diffusion region is completed before the step of selectively producing the second p-type diffusion region in separate masking and diffusing operations.

4. The method as set forth in claim 1 wherein the quantum well active layer is a multi-quantum well active layer comprising alternate quantum barrier and quantum well layers.

5. The method as set forth in claim 1 wherein the step of forming an n-side electrode comprises forming an electrode displaced from the non-disordered active region by a distance of about the width of the second p-type diffusion region.

6. A method of fabricating a planar type semiconductor laser having p-side and n-side electrodes on the same surface of the laser device, the method comprising the steps of:
   successively forming layers on said substrate to form an upper surface, said layers including in succession at least a lower cladding layer, an active layer, and an upper cladding layer, doping both the lower and upper cladding layers with p-type impurities,
   masking said upper surface to produce a first aperture, conducting a p-type diffusion through the masked aperture to form a first p-type diffusion region extending through said layers and into the substrate,
   masking said upper surface to produce a second aperture generally parallel to the first aperture but narrower than the first aperture, conducting a p-type diffusion through the second masked aperture to form a second p-type diffusion region shallower than the first and having a diffusion front terminating in the lower cladding layer to leave a region of n-type conductivity in the lower cladding layer below the diffusion front of the second p-type diffusion region,
   controlling the relative position of the apertures and the diffusion conditions to cause said first and second p-type diffusion regions to define a central non-disordered active stripe in the active layer between said diffusion regions,
   forming an n-side electrode on said upper surface in electrical contact with the n-type cladding layers, and forming a p-side electrode on said upper surface in electrical contact with the first p-type diffusion region.

7. The method as set forth in claim 6 wherein the steps of masking said upper surface comprise forming a silicon nitride layers and patterning said layers to form said masks.

8. A method of fabricating a planar type semiconductor laser having p-side and n-side electrodes on the same surface of the laser device, the method comprising the steps of:

successively forming layers on said substrate to form an upper surface, said layers including in succession at least a lower cladding layer, an active layer, and an upper cladding layer, doping both the lower and upper cladding layers with n-type impurities, masking said upper surface to produce a pair of apertures defining an elongate stripe between said apertures, conducting a p-type diffusion through the masked apertures to form a first and second p-type diffusion region, the first p-type diffusion region being wider than the second and extending through said layers and reaching the substrate, the second p-type diffusion region being narrower than the first and extending only as far as the lower cladding layer leaving a region of n-type conductivity in the lower cladding layer below the front of the second p-type diffusion region, conducting said diffusions in such a way as to form a narrow stripe-like region in the active layer confined by the disordered regions, forming an n-side electrode on said upper surface in electrical contact with the n-type cladding layers, and forming a p-side electrode on said upper surface in electrical contact with the first p-type diffusion region.

9. The method as set forth in claim 8 wherein the step of masking said upper surface comprises forming a silicon nitride layer on said upper surface and patterning said layer to produce said pair of apertures.

* * * * *